US009165650B2

(12) United States Patent
Hoff et al.

(10) Patent No.: US 9,165,650 B2
(45) Date of Patent: Oct. 20, 2015

(54) HYBRID DYNAMIC-STATIC ENCODER WITH OPTIONAL HIT AND/OR MULTI-HIT DETECTION

(71) Applicant: QUALCOMM Incorporated, San Diego, CA (US)

(72) Inventors: David Paul Hoff, Raleigh, NC (US); Tracey A. Della Rova, Wake Forest, NC (US); Jason P. Martzloff, Chapel Hill, NC (US)

(73) Assignee: QUALCOMM Incorporated, San Diego, CA (US)

( * ) Notice: Subject to any disclaimer, the term of this patent is extended or adjusted under 35 U.S.C. 154(b) by 248 days.

(21) Appl. No.: 13/798,767

(22) Filed: Mar. 13, 2013

(65) Prior Publication Data

US 2014/0223093 A1 Aug. 7, 2014

Related U.S. Application Data

(60) Provisional application No. 61/761,841, filed on Feb. 7, 2013.

(51) Int. Cl.
*G11C 15/04* (2006.01)
*G06F 7/74* (2006.01)

(52) U.S. Cl.
CPC . *G11C 15/04* (2013.01); *G06F 7/74* (2013.01)

(58) Field of Classification Search
None
See application file for complete search history.

(56) References Cited

U.S. PATENT DOCUMENTS

| | | | |
|---|---|---|---|
| 5,291,444 A | 3/1994 | Scott et al. | |
| 6,392,910 B1 * | 5/2002 | Podaima et al. | 365/49.18 |
| 6,831,587 B1 * | 12/2004 | Joshi | 341/160 |
| 6,983,388 B2 | 1/2006 | Kaxiras et al. | |
| 7,134,105 B2 * | 11/2006 | Singh et al. | 716/103 |
| 7,401,180 B1 | 7/2008 | James et al. | |

(Continued)

FOREIGN PATENT DOCUMENTS

| | | |
|---|---|---|
| EP | 0440221 A2 | 8/1991 |
| EP | 0858077 A2 | 8/1998 |
| JP | 2001256787 A | 9/2001 |

OTHER PUBLICATIONS

International Search Report and Written Opinion—PCT/US2014/015161—ISA/EPO—Jul. 8, 2014.

*Primary Examiner* — Charles Rones
*Assistant Examiner* — Hewy Li
(74) *Attorney, Agent, or Firm* — Muncy, Geissler, Olds & Lowe, P.C.

(57) ABSTRACT

The hybrid dynamic-static encoder described herein may combine dynamic and static structural and logical design features that strategically partition dynamic nets and logic to substantially eliminate redundancy and thereby provide area, power, and leakage savings relative to a fully dynamic encoder with an equivalent logic delay. For example, the hybrid dynamic-static encoder may include identical top and bottom halves, which may be combined to produce final encoded index, hit, and multi-hit outputs. Each encoder half may use a dynamic net for each index bit with rows that match a search key dotted. If a row has been dotted to indicate that the row matches the search key, the dynamic nets associated therewith may be evaluated to reflect the index associated with the row. Accordingly, the hybrid dynamic-static encoder may have a reduced set of smaller dynamic nets that leverage redundant pull-down structures across the index, hit, and multi-hit dynamic nets.

23 Claims, 10 Drawing Sheets

(56) References Cited

U.S. PATENT DOCUMENTS

| | | |
|---|---|---|
| 7,461,236 B1 | 12/2008 | Wentzlaff |
| 7,940,555 B2 | 5/2011 | De Sandre |
| 2004/0130924 A1* | 7/2004 | Ma et al. .......................... 365/49 |
| 2005/0125185 A1* | 6/2005 | Singh et al. .................... 702/118 |
| 2007/0019455 A1* | 1/2007 | Lysinger .......................... 365/49 |
| 2008/0239778 A1 | 10/2008 | Shastry et al. |
| 2009/0049230 A1* | 2/2009 | Pandya .......................... 711/101 |
| 2012/0069688 A1 | 3/2012 | Behrends et al. |

\* cited by examiner

HYBRID DYNAMIC-STATIC ENCODER WITH OPTIONAL HIT AND/OR MULTI-HIT DETECTION

PRIORITY CLAIM UNDER 35 U.S.C. §119

Pursuant to 35 U.S.C. §119, the present application claims priority to U.S. Provisional Patent Application Ser. No. 61/761,841, entitled "HYBRID DYNAMIC-STATIC ENCODER WITH OPTIONAL HIT AND/OR MULTI-HIT DETECTION," filed Feb. 7, 2013, which is hereby incorporated by reference in its entirety.

FIELD OF DISCLOSURE

The present application generally relates to a hybrid dynamic-static encoder with optional hit and/or multi-hit detection, and in particular, to an encoder having a combined dynamic and static structural and logical design that may substantially reduce the physical area, power consumption, and leakage associated therewith with a logic delay substantially similar or equivalent to a fully dynamic solution.

BACKGROUND

Processors typically perform computational tasks in various applications, which may include embedded applications associated with portable or mobile electronic devices. The ever-expanding feature set and enhanced functionality associated with these electronic devices generally demands evermore computationally powerful processors. For example, most modern processors store recently executed instructions and recently used data in one or more cache memories that an instruction execution pipeline can readily access to capitalize on spatial and temporal locality properties associated with most programs or applications. In particular, a cache generally refers to a high-speed (usually on-chip) memory structure comprising a random access memory (RAM) that stores data and/or a corresponding content addressable memory (CAM) that stores addresses corresponding to the data stored in the RAM.

In general, a CAM refers to an array of memory cells and associated comparison circuitry that enables a search operation to be completed relatively rapidly. This ability allows search hardware implementation of search algorithms, which may provide greater speed relative to software implemented search algorithms. As such, a CAM may be used in various applications (e.g. cache memory) that require faster access to data more likely to be accessed by a processor. For example, to determine whether a cache memory stores a particular data word, all rows in the CAM array may be searched or otherwise evaluated in parallel to determine whether the address of the word matches any addresses stored in the CAM. More generally, in any suitable CAM application, all rows in the CAM array may be searched or otherwise evaluated to determine whether or not an input value matches the value stored in any rows in the CAM. Accordingly, each row in the CAM may be associated with a respective match line that indicates the search result associated with that row, wherein the match line associated with each row may be asserted to indicate that the row matches the input value or unasserted to indicate that the row mismatches the input value.

When reading out the index that corresponds to an entry in a searchable array structure (e.g., a CAM) that matches a search key, the address associated with the matching entry may generally be encoded prior to being read from the searchable array structure. Furthermore, a multi-hit detection similarly requires encoding the addresses associated with the matching entries prior to reading the matching addresses from the searchable array structure to ensure efficiency. However, existing dynamic encoder implementations tend to require a separate dynamic net for each index bit in the array structure, which can cause the encoder to occupy a very large physical area, consume substantial power, and suffer from significant leakage due to the many pull-downs required across the various dynamic nets. Although encoder circuitry can alternatively be implemented using static logic, static implementations tend to require extra logic depth to encode large numbers of rows, which may result in a delay penalty.

Accordingly, an improved encoder design may be desirable to address these and other problems associated with existing encoder designs that employ fully dynamic or fully static solutions.

SUMMARY

The following presents a simplified summary of one or more embodiments of the hybrid dynamic-static encoder disclosed herein in order to provide a basic understanding of such embodiments. As such, this summary should not be considered an extensive overview of all contemplated embodiments, nor is this summary intended to identify key or critical elements of all embodiments described herein or delineate the scope of any particular embodiment. Accordingly, the sole purpose of this summary is to present certain concepts relating to one or more embodiments relating to the hybrid dynamic-static encoder with optional hit and/or multi-hit detection disclosed herein in a simplified form as a prelude to the more detailed description presented below.

According to various embodiments, the hybrid dynamic-static encoder described herein may combine dynamic and static design structures and associated logic to achieve substantially reduced area, power consumption, and leakage with a logic delay generally equivalent to a fully dynamic solution. More particularly, in contrast to existing dynamic encoder implementations that tend to require separate dynamic nets for each index bit (and additional dynamic nets for each index bit to support multi-hit detection) or static encoder implementations that tend to introduce delay penalties due to the extra logic depth needed to encode large numbers of rows, the hybrid dynamic-static encoder described herein may strategically partition dynamic nets and logic to substantially eliminate redundancy in the encoder structure and thereby reduce the size (or area), power consumption, and leakage associated therewith without introducing any substantial logic delay. For example, in a 128-entry array with encoded index, hit detection, and multi-hit detection outputs, the hybrid dynamic-static encoder described herein may have 384 dynamic pull-downs compared to 1024 dynamic pull-downs in a fully dynamic encoder (i.e., three dynamic pull-downs per entry in the array associated with the hybrid dynamic-static encoder described herein versus eight dynamic pull-downs per entry in a fully dynamic encoder). Accordingly, whereas a fully dynamic encoder may have sixteen dynamic pull-down columns, the hybrid dynamic-static encoder described herein may have only three dynamic pull-down columns. Furthermore, a single row hit would require evaluating eight large dynamic nets in a fully dynamic encoder, whereas a single row hit only requires evaluating three dynamic nets in the hybrid dynamic-static encoder described herein.

According to various embodiments, the design approach used in the hybrid dynamic-static encoder described herein may generally be applied to an array having any suitable size.

However, to simplify the description associated with the design approach used in the hybrid dynamic-static encoder described herein, a 128-entry array will be used to illustrate and explain the various structural and logical features associated with the hybrid dynamic-static encoder described herein. For example, a 128-entry array used in the hybrid dynamic-static encoder with optional hit and/or multi-hit detection may be divided into identical top and bottom halves, which may then be combined to produce the final encoded index, hit, and multi-hit outputs. In particular, each encoder half may use a dynamic net for each index bit with appropriate rows dotted to indicate when a row matches a search key, wherein each dynamic net may have thirty-two dots. As such, when a particular row in the array has been dotted to indicate that the row matches the search key, the dynamic nets associated with the row may be evaluated to reflect the seven-bit index associated with the row. Furthermore, each index bit may have a corresponding multi-hit dynamic net, which may be dotted across the various rows in the array to reflect the inverse of the corresponding index bit. As such, if a multi-hit occurs, one or more index bits will have both the index and multi-hit dynamic nets evaluated to flag the multi-hit. Moreover, a hit dynamic net that has every row dotted may be provided, wherein the hit dynamic net may be divided into two dynamic nets and subsequently merged to reduce loading. Accordingly, the hybrid dynamic-static encoder described herein may advantageously leverage redundancy in pull-down structures across the various index, hit, and multi-hit dynamic nets and use logic to derive the same information from a reduced set of smaller dynamic nets.

According to one embodiment, a hybrid dynamic-static encoder with optional hit detection and/or multi-hit detection may comprise, among other things, an array structure having X rows that are respectively dotted onto one or more of a plurality of dynamic nets arranged across one or more device active area (DAA) columns. In one embodiment, each DAA column may have X pull-downs arranged across Y dynamic nets. The hybrid dynamic-static encoder may further comprise merging logic configured to combine output signals generated in the plurality of dynamic nets and derive one or more encoded index signals that indicate whether one or more rows in the array structure match a search key based on the combined output signals. Additionally, in one embodiment, the merging logic may be further configured to derive a hit signal that indicates whether at least one row in the array structure matches the search key and/or a multi-hit signal that indicates whether multiple rows in the array structure match the search key based on the combined output signals (e.g., when at least one encoded index signal uniquely identifies at least one row in the array structure that matches the search key). Accordingly, the hybrid dynamic-static encoder may substantially eliminate redundant pull-down structures across an index dynamic net, a hit dynamic net, and/or a multi-hit dynamic net to provide substantial physical area, power consumption, and leakage current savings relative to a fully dynamic encoder at a logic delay substantially equivalent to the fully dynamic encoder.

According to one embodiment, a method for detecting one or more hits in a searchable array structure may comprise receiving a search key and searching an array structure associated with a hybrid dynamic-static encoder having optional hit detection and/or multi-hit detection using the received search key. In one embodiment, the array structure may have X rows and the hybrid dynamic-static encoder may include various dynamic nets arranged across one or more DAA columns, wherein each DAA column may have X pull-downs arranged across Y dynamic nets. In one embodiment, the method may further comprise deriving one or more encoded index signals that indicate whether one or more rows in the array structure that match the search key based on combined output signals generated in the plurality of dynamic nets. Additionally, in one embodiment, the method may further comprise deriving a hit signal that indicates whether at least one row in the array structure matches the search key and/or a multi-hit signal that indicates whether multiple rows in the array structure match the search key based on the combined output signals (e.g., the hit signal may indicate that at least one row matches the search key when at least one encoded index signal uniquely identifies at least one row in the array structure that matches the search key and the multi-hit signal may similarly indicate that multiple rows match the search key when multiple encoded index signals uniquely identify multiple respective rows in the array structure that match the search key).

According to one embodiment, an apparatus may comprise means for receiving a search key and means for searching an array structure associated with a hybrid dynamic-static encoder having optional hit detection and/or multi-hit detection using the received search key. In one embodiment, the array structure may have X rows and the hybrid dynamic-static encoder may include various dynamic nets arranged across one or more DAA columns, wherein each DAA column may have X pull-downs arranged across Y dynamic nets. In one embodiment, the apparatus may further comprise means for deriving one or more encoded index signals that indicate whether one or more rows in the array structure that match the search key based on combined output signals generated in the plurality of dynamic nets. Additionally, in one embodiment, the apparatus may further comprise means for deriving a hit signal that indicates whether at least one row in the array structure matches the search key and/or a multi-hit signal that indicates whether multiple rows in the array structure match the search key based on the combined output signals (e.g., the hit signal may indicate that at least one row matches the search key when at least one of the encoded index signals uniquely identifies at least one row in the array structure that matches the search key and the multi-hit signal may indicate that multiple rows match the search key when multiple encoded index signals uniquely identify multiple rows in the array structure that match the search key).

According to one embodiment, a computer-readable storage medium may have computer-executable instructions recorded thereon, wherein executing the computer-executable instructions on one or more processors may cause the one or more processors to receive a search key and search an array structure associated with a hybrid dynamic-static encoder having optional hit detection and/or multi-hit detection using the received search key. In one embodiment, the array structure may have X rows and the hybrid dynamic-static encoder may include various dynamic nets arranged across one or more DAA columns, wherein each DAA column may have X pull-downs arranged across Y dynamic nets. In one embodiment, executing the computer-executable instructions on one or more processors may further cause the one or more processors to derive one or more encoded index signals that indicate whether one or more rows in the array structure that match the search key based on combined output signals generated in the plurality of dynamic nets. Additionally, in one embodiment, executing the computer-executable instructions on one or more processors may further cause the one or more processors to derive a hit signal that indicates whether at least one row in the array structure matches the search key and/or a multi-hit signal that indicates whether multiple rows in the array structure match the search key based on the combined output signals (e.g., when at least one encoded index signal uniquely identifies at least one row in the array structure that matches the search key).

According to one embodiment, a hybrid dynamic-static encoder with optional hit detection and/or multi-hit detection may comprise an array structure having X rows, one or more first DAA columns having X pull-downs arranged across X/8 dynamic nets that each span X/4 rows, and one or more second DAA columns each having X pull-downs arranged across X/16 dynamic nets that each span X/4 rows, wherein the DAA columns may generally comprise physical areas to house one or more of n-channel field effect transistor (NFET) devices, p-channel field effect transistor (PFET) devices, diffused silicon logic components, or circuitry to produce output signals generated therein. Furthermore, the hybrid dynamic-static encoder may comprise means for deriving one or more encoded index signals that indicate whether one or more rows in the array structure match a search key based on combined output signals generated in the first DAA column and the one or more second DAA columns. Additionally, in one embodiment, the hybrid dynamic-static encoder may further comprise means for deriving a hit signal that indicates whether at least one row in the array structure matches the search key based on the combined output signals and/or means for deriving a multi-hit signal that indicates whether multiple rows in the array structure match the search key based on the combined output signals (e.g., when at least one encoded index signal uniquely identifies a row in the array structure that matches the search key).

Other objects and advantages associated with the embodiments relating to the hybrid dynamic-static encoder described herein will be apparent to those skilled in the art based on the accompanying drawings and detailed description.

BRIEF DESCRIPTION OF THE DRAWINGS

The accompanying drawings are presented to aid in the description of the embodiments disclosed herein and are provided solely to illustrate exemplary features associated with the disclosed embodiments without defining any limitations thereof.

DETAILED DESCRIPTION

Aspects are disclosed in the following description and related drawings to show specific examples relating to various exemplary embodiments of a hybrid dynamic-static encoder with optional hit and/or multi-hit detection. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein describes particular embodiments only and should be construed to limit any embodiments disclosed herein. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
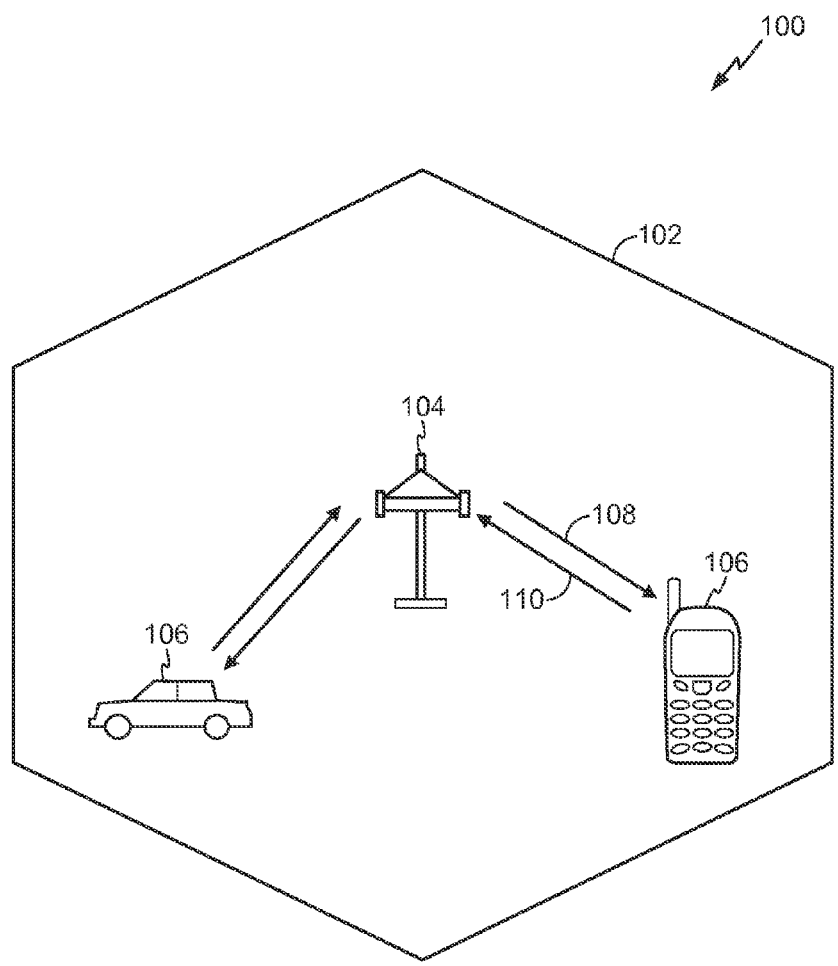
FIG. 1 illustrates an exemplary wireless communication system that includes a mobile device with a memory architecture that may implement the hybrid dynamic-static encoder described herein, according to one exemplary embodiment.

According to one embodiment, FIG. 1 illustrates a wireless communication system 100 that includes one or more mobile devices 106 with memory architectures that may implement the hybrid dynamic-static encoder with optional hit and/or multi-hit detection described herein. In one embodiment, the wireless communication system 100 may operate pursuant to any suitable wireless standard. For example, the wireless communication system 100 may be a multiple-access network that can share available network resources to support multiple users, wherein exemplary multiple-access networks may include Code Division Multiple Access (CDMA) networks, Time Division Multiple Access (TDMA) networks, Frequency Division Multiple Access (FDMA) networks, and Orthogonal FDMA (OFDMA) networks. These multiple-access networks may implement various radio technologies, wherein the terms "radio technology," "radio access technology" (RAT), "access technology," and "air interface" may often be used interchangeably. A CDMA network may implement a radio technology such as cdma2000 (e.g., pursuant to one or more of the IS-2000, IS-856, and/or IS-95 standard), Wideband-CDMA (W-CDMA), or other suitable radio technologies. A CDMA2000 1x network (or simply "1x network") refers to a wireless network that implements IS-2000 and/or IS-95. A CDMA2000 1xEV-DO network (or simply "1xEV-DO network") refers to a wireless network that implements IS-856. A Universal Mobile Telecommunications System (UMTS) network is a wireless network that implements W-CDMA. A TDMA network may implement a radio technology such as Global System for Mobile Communications (GSM). These various radio technologies, standards, and cellular networks are known in the art. W-CDMA, GSM and UMTS are described in documents from an organization named "3rd Generation Partnership Project" (3GPP), while cdma2000 is described in documents from an organization named "3rd Generation Partnership Project 2" (3GPP2). 3GPP and 3GPP2 documents are publicly available.

In one embodiment, in addition to the one or more mobile devices 106, the wireless communication system 100 shown in FIG. 1 may include an access point (AP) 104 that communicates with the one or more mobile devices 106, wherein the AP 104 may also comprise, be implemented as, or known as a NodeB, a Radio Network Controller (RNC), an eNodeB, a Base Station Controller (BSC), a Base Transceiver Station (BTS), a Base Station (BS), a Transceiver Function (TF), a Radio Router, a Radio Transceiver, or other suitable terminology.

In general, the AP 104 may serve as a hub or base station for the wireless communication system 100 and the one or more mobile devices 106 may serve as users in the wireless communication system 100. For example, in one embodiment, a mobile device 106 may be a laptop computer, a personal digital assistant (PDA), a mobile phone, or any other suitable device that supports wireless communication. A mobile device 106 may also comprise, be implemented as, or known as a mobile station (STA), a terminal, an access terminal (AT), a user equipment (UE), a subscriber station, a subscriber unit, a remote station, a remote terminal, a user terminal, a user agent, a user device, or other suitable terminology. In various embodiments, the mobile devices 106 may also comprise cellular telephones, cordless telephones, Session Initiation Protocol (SIP) phones, wireless local loop (WLL) stations, PDAs, handheld devices having wireless connection capabilities, or other suitable processing devices connected to wireless modems. Accordingly, one or more embodiments described herein may be incorporated into a phone (e.g., a cellular phone or smartphone), a computer (e.g., a laptop), a portable communication device, a headset, a portable computing device (e.g., a personal data assistant), an entertainment device (e.g., a music device, a video device, a satellite radio, etc.), a gaming device or system, a global positioning system device, or any other suitable device that is configured to communicate via a wireless medium.

In one embodiment, the wireless communication system 100 may comprise a wireless local area network (WLAN) in which the mobile devices 106 connect to the AP 104 via a Wi-Fi compliant wireless link (e.g. an IEEE 802.11 protocol) to obtain general Internet connectivity or connectivity to another wide area network (WAN). In one embodiment, a mobile device 106 may also be used as the AP 104 (e.g. pursuant to the Wi-Fi Direct standard). The mobile devices 106 and the AP 104 may generally be referred to as transmitting or receiving nodes in the wireless communication system 100. In one embodiment, various processes and mechanisms may be used to support transmissions in the wireless communication system 100 between the mobile devices 106 and the AP 104. For example, in one embodiment, the transmissions in the wireless communication system 100 may generally include signals sent from the AP 104 and received at the mobile devices 106 and signals sent from the mobile devices 106 and received at the AP 104 in accordance with OFDM/OFDMA techniques, in which case the wireless communication system 100 may be referred to as an OFDM/OFDMA system. Alternatively (or additionally), the signals may be sent from and received at the AP 104 and the mobile devices 106 in accordance with CDMA techniques, in which case the wireless communication system 100 may be referred to as a CDMA system.

In one embodiment, a communication link that carries transmissions from the AP 104 to one or more of the mobile devices 106 may be referred to as a downlink (DL) 108, wherein the downlink 108 may also be referred to as a forward link or forward channel, and a communication link that carries transmissions from one or more of the mobile devices 106 to the AP 104 may be referred to as an uplink (UL) 110, wherein the uplink 110 may also be referred to as a reverse link or a reverse channel. In one embodiment, as noted above, the AP 104 may generally act as a base station or hub to provide wireless communication coverage in a basic service area (BSA) 102. In one embodiment, the AP 104 and the mobile devices 106 that use the AP 104 for wireless communication in the BSA 102 may be referred to as a basic service set (BSS). However, those skilled in the art will appreciate that the wireless communication system 100 may not necessarily have a central AP 104, but rather may function as a peer-to-peer or ad-hoc network between the mobile devices 106. Accordingly, the functions of the AP 104 described herein may alternatively be implemented or otherwise performed by one or more of the mobile devices 106 (e.g., pursuant to the Wi-Fi direct standard).

Figure 2:
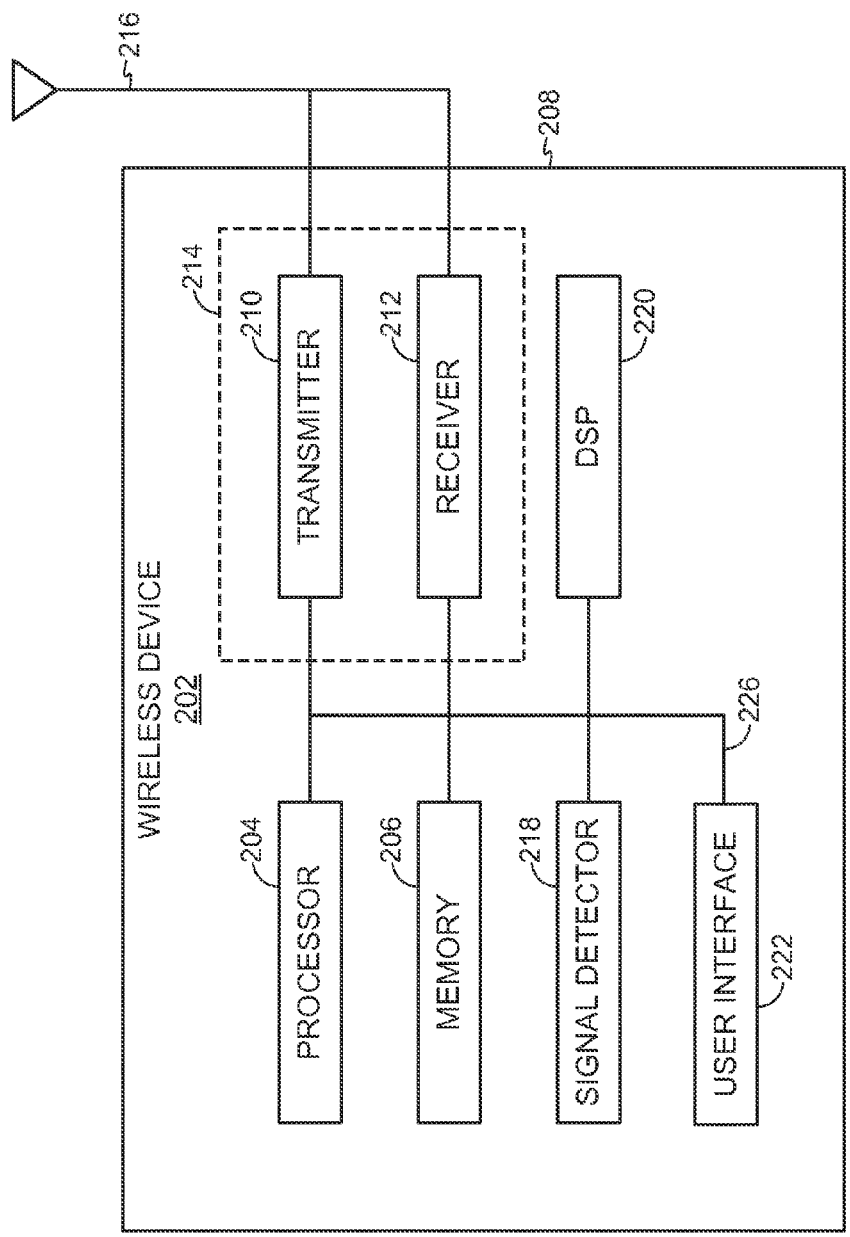
FIG. 2 illustrates an exemplary mobile device with a memory architecture that may implement the hybrid dynamic-static encoder described herein, according to one exemplary embodiment.

According to one embodiment, FIG. 2 illustrates a mobile device 202 with a memory architecture that may implement the hybrid dynamic-static encoder described herein within the wireless communication system 100 shown in FIG. 1. In one embodiment, the mobile device 202 may represent any suitable device that can include or be configured to implement the various features associated with the hybrid dynamic-static encoder described herein. For example, in certain embodiments, the mobile device 202 shown in FIG. 2 may comprise the AP 104 shown in FIG. 1, one of the mobile devices 106 shown in FIG. 1, or one of the mobile devices 106 shown in FIG. 1 that implements or otherwise performs the functions of the AP 104 shown in FIG. 1. However, those skilled in the art will appreciate that the hybrid dynamic-static encoder may be employed or otherwise implemented in any suitable electrical device, circuit, or other component that can receive multiple electrical signals that generally represent a search key and use the hybrid dynamic-static encoder to detect whether one or more entries in an array structure associated therewith match the search key, generate a binary hit detection output to indicate whether at least one entry in the array structure matches the search key, generate a binary multi-hit detection output to indicate whether at least two entries in the array structure matches the search key, and/or generate unique index numbers to identify any entries in the array structure that match the search key.

In one embodiment, the mobile device 202 may include a processor 204 that controls operation of the mobile device 202. The processor 204 may also be referred to as a central processing unit (CPU). In addition, the mobile device 202 may include a memory 206, which may include RAM, read-only memory (ROM), content addressable memory (CAM), DDR memory, or other suitable memory technologies. In one embodiment, the memory 206 may store instructions and data that the processor 204 may execute and/or utilize to control the operation of the mobile device 202. In one embodiment, the memory 206 may further include non-volatile random access memory (NVRAM). The processor 204 may generally perform logical and arithmetic operations based on the instructions stored in the memory 206 and/or execute the instructions stored in the memory 206 to implement or otherwise carry out various functions.

In one embodiment, the mobile device 202 may further include a housing 208 and a transceiver 214 having a transmitter 210 and a receiver 212 to allow transmission and reception of data between the mobile device 202 and a remote entity (e.g., a base station or AP, another mobile device, etc.). In one embodiment, the data may be transmitted to and received from the remote entity via an antenna 216, which may be attached to the housing 208 and electrically coupled to the transceiver 214. Furthermore, those skilled in the art will appreciate that the mobile device 202 may suitably include multiple transmitters, multiple receivers, multiple transceivers, and/or multiple antennas.

In one embodiment, the mobile device 202 may further include a signal detector 218 that may be used to detect and quantify the levels of signals transmitted and received via the transceiver 214. The signal detector 218 may detect such signals as total energy, energy per subcarrier per symbol, power spectral density, and other suitable signals. The mobile device 202 may also include a digital signal processor (DSP) 220 for use in processing the signals transmitted and received via the transceiver 214. For example, in one embodiment, the DSP 220 may be configured to generate data units for transmission via the transmitter 210. In various embodiments, the data unit may comprise a physical layer protocol data unit (PPDU), which may also be referred to as a packet or message, as will be apparent.

In one embodiment, the mobile device 202 may further include a user interface 222, which may comprise a keypad, a microphone, a speaker, a display, and/or other suitable elements or components that can convey information to a user of the mobile device 202 and/or receive input from the user. Furthermore, in one embodiment, the various components of the mobile device 202 may be coupled together via a bus system 226. For example, the bus system 226 may include an interconnection fabric, a data bus, a power bus, a control signal bus, a status signal bus, or any other suitable component that can interconnect or otherwise couple the various components of the mobile device 202 to one another. However, those skilled in the art will appreciate that the components of the mobile device 202 may be coupled or accept or provide inputs to each other using other suitable mechanisms.

Furthermore, although FIG. 2 illustrates the mobile device 202 as having various separate components, those skilled in the art will recognize that one or more of the components may be suitably combined or commonly implemented. For example, the processor 204 may implement the functionality described above with respect thereto in addition to the functionality described above with respect to the signal detector 218 and/or the DSP 220. Further, those skilled in the art will recognize that any particular component illustrated in FIG. 2 may be implemented using multiple separate elements (e.g., the transmitter 210 may include multiple transmitters 210, the receiver 212 may include multiple receivers 212, etc.).

Figure 3:
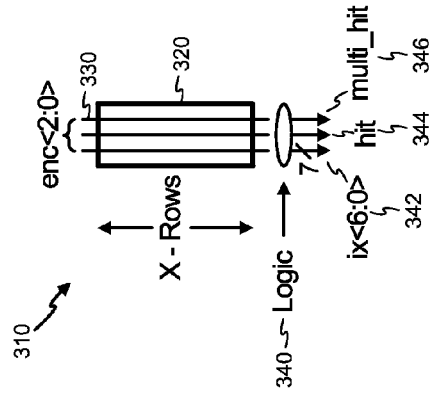
FIG. 3 illustrates a structure that may be used in the hybrid dynamic-static encoder described herein relative to a fully dynamic encoder structure, according to one exemplary embodiment.
Figure 3:
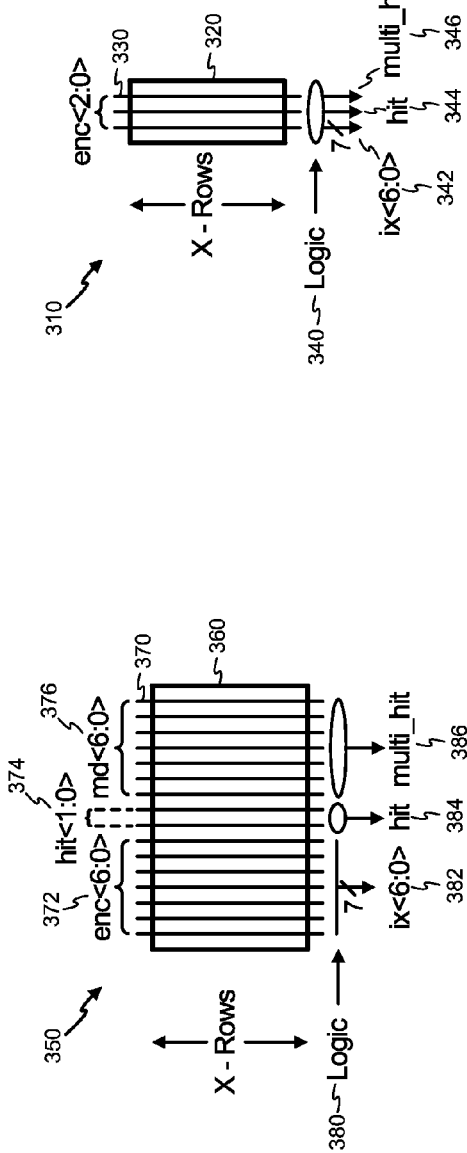

According to one exemplary embodiment, FIG. 3 illustrates an exemplary hybrid dynamic-static encoder structure 310 according to the various aspects and embodiments described herein relative to a fully dynamic encoder structure 350, wherein the hybrid dynamic-static encoder structure 310 and the fully dynamic encoder structure 350 shown in FIG. 3 may each include a respective searchable array structure 320, 360 and associated logic 340, 380 to encode the address corresponding to one or more entries that match a search key prior to reading the indices associated with the matching entries out from the searchable array structure 320, 360. However, the fully dynamic encoder structure 350 shown therein requires a separate dynamic net for each index bit 382 and further requires a second dynamic net for each index bit to support a multi-hit detection bit 386. Accordingly, the fully dynamic encoder structure 350 may occupy a very large physical area, consume substantial power, and suffer substantial leakage due to the many pull-downs required across the many dynamic nets. In particular, the fully dynamic encoder structure 350 shown in FIG. 3 may have sixteen device active area (DAA) columns 370, which generally refers to the physical area that various physical devices occupy within the encoder structure 350. For example, the fully dynamic encoder structure 350 generally requires the sixteen DAA columns 370 to house various n-channel field effect transistor (NFET) devices, p-channel field effect transistor (PFET) devices, diffused silicon logic components, and/or other appropriate circuitry to produce seven encoded index outputs 372 that the logic 380 combines to produce the index bits 382, seven multi-hit detection outputs 376 that the logic 380 combines to produce the multi-hit detection bit 386, and two hit detection outputs 374 that the logic 380 combines to produce the hit detection bit 384, wherein each DAA column 370 has X/2 dynamic pull-downs, where X refers to how many rows are included in the searchable array structure 360. Furthermore, because pull-downs are dotted across one or more dynamic nets to indicate when one or more rows match a search key (e.g., by asserting respective match lines associated with the one or more rows), the fully dynamic encoder structure 350 shown in FIG. 3 has 8X total dynamic pull-downs.

Figure 4:
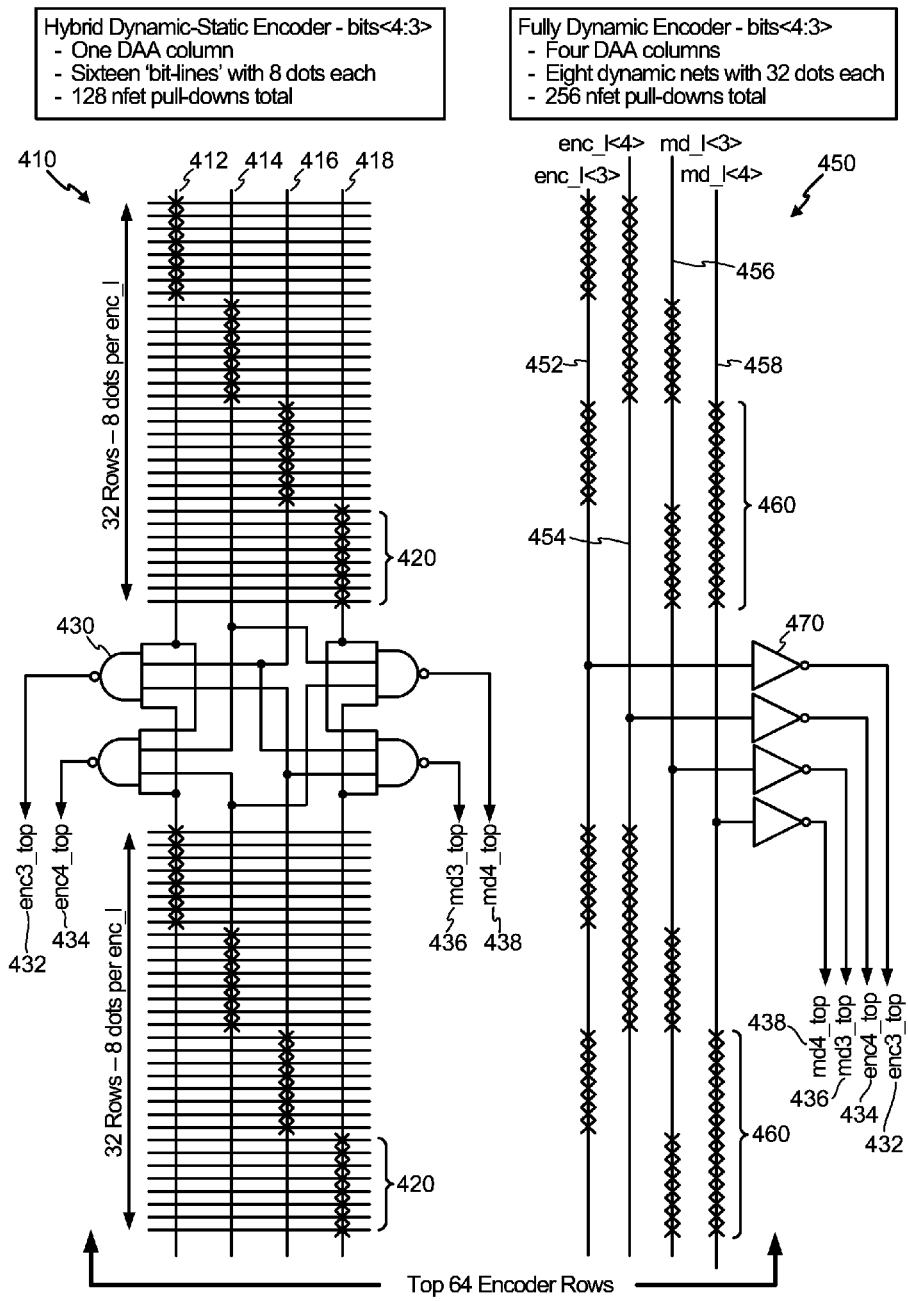
FIGS. 4-6 illustrate exemplary searchable array structures and associated comparison circuitry that may be used in the hybrid dynamic-static encoder described herein relative to a fully dynamic encoder, according to one exemplary embodiment.
Figure 5:
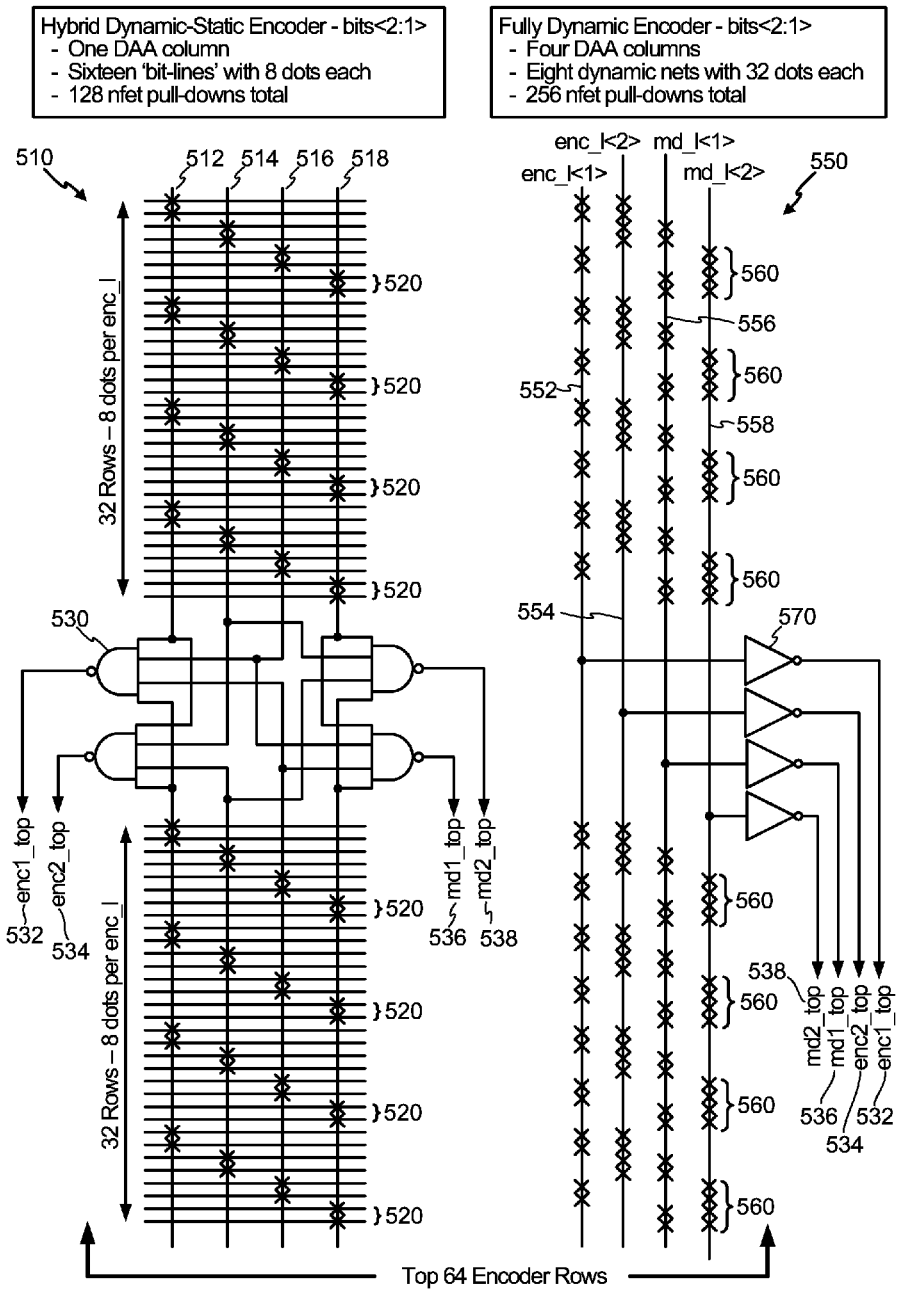
Figure 6:
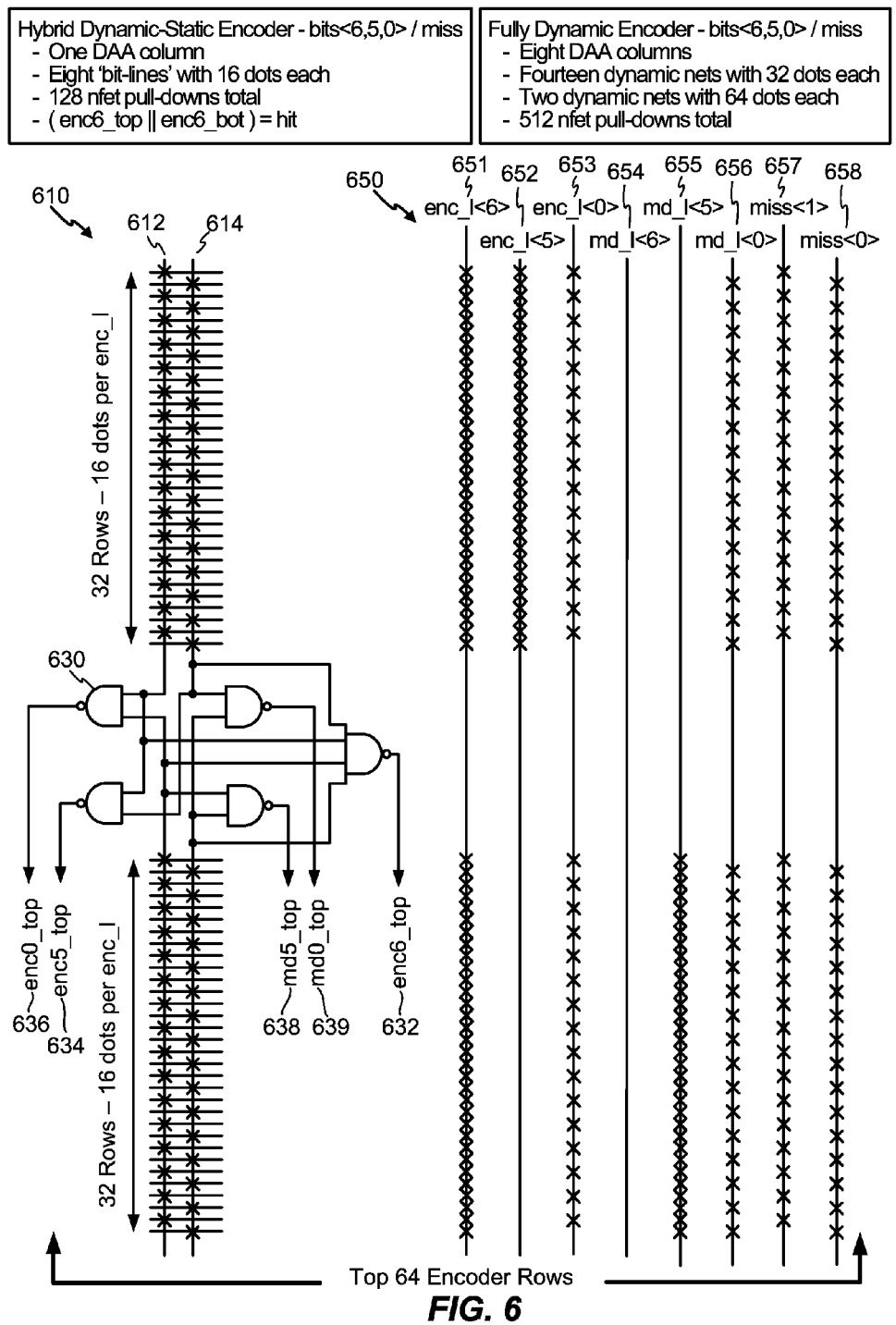

In contrast, the hybrid dynamic-static encoder structure 310 shown therein may have a combined dynamic and static structural and associated logical design to achieve substantially reduced area, power consumption, and leakage with a logic delay generally equivalent to the fully dynamic encoder structure 350 further shown in FIG. 3. More particularly, as will be described in further detail below with reference to FIGS. 4-6, the hybrid dynamic-static encoder structure 310 may strategically partition dynamic nets and logic to substantially eliminate redundancy in the encoder structure 310 and thereby substantially reduce the size (or area), power consumption, and leakage associated therewith without introducing any substantial logic delay. For example, in a searchable array structure 320 with X rows, the hybrid dynamic-static encoder structure 310 may have three DAA columns 330 to house the physical NFET devices, PFET devices, diffused silicon logic components, and/or other appropriate circuitry needed to produce index bits 342, hit detection bit 344, and multi-hit detection bit 346 (i.e., the same outputs as the fully dynamic encoder structure 350) with a substantially equivalent logic delay as the fully dynamic encoder structure 350. Specifically, in the exemplary hybrid dynamic-static encoder structure 310 shown in FIG. 3, Column<2>, Column<1>, and Column<0>respectively correspond to the hybrid dynamic-static encoder columns 410, 510, and 610 shown in FIGS. 4-6, whereas the fully dynamic encoder portions 450 and 550 shown in FIGS. 4-5 each include four DAA columns (i.e., two encoded index columns 372 and the two multi-hit columns 376 corresponding thereto) and the fully dynamic encoder portion 650 shown in FIG. 6 includes eight DAA columns (i.e., three encoded index columns 372, the three multi-hit columns 376 corresponding thereto, and the two hit detection columns 374). Accordingly, as shown in FIGS. 4-6 and described more fully below, Columns<0:2>330 in the hybrid dynamic-static encoder 310 may be used together to produce the multi-hit detection output 346 and the encoded index outputs 342, wherein Columns<0:2>330 may each have X pull-downs such that the hybrid dynamic-static encoder structure 310 has 3X total dynamic pull-downs. Furthermore, in one embodiment, the hit detection output 344 may be derived from a single one of Columns<0:2>330. As such, whereas a single row hit would require the fully dynamic encoder structure 350 to evaluate eight large dynamic nets, the hybrid dynamic-static encoder structure 310 need only evaluate three dynamic nets in response to a single row hit. Accordingly, due to the substantially fewer DAA columns 330 in the hybrid dynamic-static encoder structure 310 relative to the number of DAA columns 370 in the fully dynamic encoder structure 350, the hybrid dynamic-static encoder structure 310 may realize a 530% area savings relative to the fully dynamic encoder structure 350 (i.e., sixteen DAA columns 370 divided by three DAA columns 330), a 267% leakage savings relative to the fully dynamic encoder structure 310 (i.e., 8X total dynamic pull-downs divided by 3X total dynamic pull-downs), and an implementation-specific dynamic savings (e.g., depending on the number of rows or entries in the searchable array structure 320, 360).

According to one exemplary embodiment, FIGS. 4-6 illustrate exemplary searchable array structures and associated comparison circuitry that may be used in the hybrid dynamic-static encoder described herein relative to a fully dynamic encoder. Although those skilled in the art will appreciate that the design approach used in the hybrid dynamic-static encoder described herein may be applied to a searchable array structure having any suitable size, a 128-entry array size may be used in the hybrid dynamic-static and the fully dynamic encoders shown in FIGS. 4-6 and described in further detail herein to simplify the description and to explain the various structural and logical features associated therewith. For example, as will be described in further detail herein, the number of dynamic pull-downs for the 128-entry array with encoded index outputs, hit detection outputs, and multi-hit detection outputs may be reduced from 1024 dynamic pull-downs in the fully dynamic encoder to 384 dynamic pull-downs in the hybrid dynamic-static encoder, the number of columns housing the dynamic pull-downs may be reduced from sixteen in the fully dynamic encoder to three in the hybrid dynamic-static encoder, and the number of dynamic nets needed to evaluate a single row hit may be reduced from eight larger nets in the fully dynamic encoder to three smaller nets in the hybrid dynamic-static encoder. Furthermore, as would be apparent to those skilled in the art, FIGS. 4-6 represent logical depictions of the hybrid dynamic-static encoder and fully dynamic encoder circuitry illustrated therein, wherein the character "x" is used in FIGS. 4-6 to represent logical locations where NFET transistors, PFET transistors, or other suitable pull-down devices are located within a DAA column, while a DAA column refers to a physical layout in which such pull-down devices are located.

For example, referring now to FIG. 4, the 128-entry array used in the hybrid dynamic-static encoder 410 and the fully dynamic encoder 450 may be divided into identical top and bottom halves (i.e., sixty-four respective rows in the top half and the bottom half), which may subsequently be combined to produce the final encoded index, hit, and multi-hit outputs. In the fully dynamic encoder 450, each encoder half may use a dynamic net having thirty-two dots 460 for each index bit with appropriate rows dotted to indicate when a row matches a search key (e.g., by asserting a match line associated with the row). As such, when a particular row in the array associated with the fully dynamic encoder 450 has been dotted to indicate that the row matches the search key, the dynamic nets associated with the dotted row may be evaluated to reflect the seven-bit index associated therewith. Furthermore, each index bit may have a corresponding multi-hit dynamic net dotted across the various rows in the array to reflect the inverse of the corresponding index bit. For example, in the fully dynamic encoder 450, multi-hit dynamic net md_1<3>456 reflects the inverse of the dynamic net 452 for index bit enc_1<3>and multi-hit dynamic net md_1<4>458 reflects the inverse of the dynamic net 454 for index bit enc_1<4>. As such, if a multi-hit occurs, one or more index bits will have both the index dynamic net 452 and/or 454 associated therewith and the corresponding multi-hit dynamic net 456 and/or 458 evaluated to flag the multi-hit. Moreover, as shown in FIG. 6, the fully dynamic encoder 650 may have a (miss) hit dynamic net with every row dotted, wherein the hit dynamic net may be divided into two respective dynamic nets 657, 658 that are subsequently merged to reduce loading. Accordingly, referring again to FIG. 4, the fully dynamic encoder 450 may have four DAA columns for bits<4:3>(i.e., two DAA columns for the respective dynamic nets 452, 454 associated with index bits enc_1<4:3>and two DAA columns for the corresponding multi-hit dynamic nets 456, 458), eight dynamic nets with thirty-two dots 460 each (i.e., the four dynamic nets 452, 454, 456, 458 that correspond to the four DAA columns in the top sixty-four rows shown in FIG. 4 and four dynamic nets (not shown) that correspond to the four DAA columns in the bottom sixty-four rows), and 256 total dynamic NFET pull-downs (i.e., one dynamic pull-down per dot in each dynamic net).

In contrast, the hybrid dynamic-static encoder shown in FIGS. 4-6 may advantageously leverage redundancy in pull-down structures across the various index, hit, and multi-hit dynamic nets associated with the fully dynamic encoder and use appropriate logic to derive the same information as the fully dynamic encoder from a reduced set of smaller dynamic nets. For example, whereas the fully dynamic encoder 450 shown in FIG. 4 has four dynamic nets 452, 454, 456, 458 with thirty-two pull-downs 460 in each of the top and bottom encoder halves (i.e., 256 total NFET pull-downs 460 between the top and bottom encoder halves), the hybrid dynamic-static encoder 410 has four smaller dynamic nets 412, 414, 416, 418 with only sixteen pull-downs 420 in each of the top and bottom encoder halves (i.e., the dynamic nets 412, 414, 416, 418 in the top encoder half each include two "bit-lines" with eight dots each and the bottom half (not shown) likewise has four dynamic nets that each include two "bit-lines" with eight dots, whereby the hybrid dynamic-static encoder column shown in FIG. 4 includes eight dynamic nets total and 128 total NFET pull-downs 420 between the top and bottom halves). Accordingly, the hybrid dynamic-static encoder 410 may provide substantial leakage savings because the total number of dynamic pull-down devices 420 may be cut in half relative to the fully dynamic encoder 450, which may further provide substantial dynamic power reduction. For example, the signals driving the dynamic pull-down devices 420 only need to drive one pull-down gate rather than two when a single row matches and therefore have one less dynamic net to pull low and subsequently pre-charge in the next phase, whereby the hybrid dynamic-static encoder 410 may substantially reduce dynamic power consumption because the signals driving the dynamic pull-down devices 420 have a smaller gate cap. Furthermore, the hybrid dynamic-static encoder 410 may have a reduced wire cap relative to the fully dynamic encoder 450 because each dynamic net 412, 414, 416, 418 includes two bit-lines that only span thirty-two rows rather than sixty-four rows and the hybrid dynamic-static encoder 410 may further have a reduced diffusion cap relative to the fully dynamic encoder 450 because each dynamic net 412, 414, 416, 418 only has eight dots per bit-line rather than thirty-two dots, whereby the hybrid dynamic-static encoder 410 may provide a substantial dynamic power savings relative to the fully dynamic encoder 450. Further still, because each row has only one dot 420 in the hybrid dynamic-static encoder, all of the dynamic pull-downs 420 across the various dynamic nets 412, 414, 416, 418 shown can be interleaved into one DAA column in the hybrid dynamic-static layout rather than the four DAA columns 452, 454, 456, 458 needed in the fully dynamic encoder 450 due to each row having multiple dynamic pull-down devices 460. Accordingly, the hybrid dynamic-static encoder 410 may provide substantial physical area savings relative to the fully dynamic encoder 450 due to the arrangement assigning one pull-down device 420 per row such that the pull-down devices (e.g., NFET pull-down transistors) 420 associated with the dynamic nets 412, 414, 416, 418 can be aligned in either a vertical or a horizontal direction.

Accordingly, as shown in FIG. 4, the hybrid dynamic-static encoder 410 may derive encoded index bits enc<4:3>and multi-hit detection bits md<4:3>from common dynamic nets enc_1<4:3>and md_1<4:3>. In particular, the first (left most) dynamic net 412 and the third dynamic net 416 in the hybrid dynamic-static encoder 410 may generally be derived from dynamic net enc_1<3>452 in the fully dynamic encoder 450. Similarly, the first and second dynamic nets 412, 414 in the hybrid dynamic-static encoder 410 may be derived from dynamic net enc_1<4>454 in the fully dynamic encoder 450, the second dynamic net 414 and the fourth (right most) dynamic net 418 in the hybrid dynamic-static encoder 410 may be derived from dynamic net md_1<3>456 in the fully dynamic encoder 450, and the third and fourth dynamic nets 416, 418 in the hybrid dynamic-static encoder 410 may be derived from dynamic net md_1<4>458 in the fully dynamic encoder 450. Accordingly, the same data may be represented in the hybrid dynamic-static encoder 410 with substantially fewer dots 420 and reduced redundancy relative to the fully dynamic encoder 450 while having a substantially equivalent gate delay count. In particular, the fully dynamic encoder 450 may have four gates (i.e., four static inverters) 470 to produce outputs enc3_top 432, enc4_top 434, md3_top 436, and md4_top 438, and the hybrid dynamic-static encoder 410 may include a static circuit 430 that also has four gates (i.e., four NAND gates) to produce the same outputs, wherein the outputs from the top sixty-four encoder rows and the corresponding outputs from the bottom sixty-four encoder rows (not shown) may be provided to appropriate logic gates to obtain the full 128-row result (i.e., as shown in FIG. 7).

Referring now to FIG. 5, the hybrid dynamic-static encoder 510 may have a similar structure to derive encoded index bits <2:1>and multi-hit detection bits md<2:1>as the structure shown in FIG. 4 and described in further detail above to derive encoded index bits <4:3>and multi-hit detection bits md<4:3>. More particularly, as shown in FIG. 5, the first and third dynamic nets 512, 516 in the hybrid dynamic-static encoder 510 may be derived from dynamic net enc_1<1>552 in the fully dynamic encoder 550, the first and second dynamic nets 512, 514 in the hybrid dynamic-static encoder 510 may be derived from dynamic net enc_1<2>554 in the fully dynamic encoder 550, the second and fourth dynamic nets 514, 518 in the hybrid dynamic-static encoder 510 may be derived from dynamic net md_1<1>556 in the fully dynamic encoder 550, and the third and fourth dynamic nets 516, 518 in the hybrid dynamic-static encoder 510 may be derived from dynamic net md_1<2>558 in the fully dynamic encoder 550. Accordingly, the same data needed to produce enc 1_top 532, enc2_top 534, md1_top 536, and md2_top 538 may be represented in the hybrid dynamic-static encoder 510 with substantially fewer dots 520 and reduced redundancy relative to the fully dynamic encoder 550 while having a substantially equivalent gate delay count (i.e., the hybrid dynamic-static encoder 510 produces signals 532-538 using a static circuit 530 with four NAND gates and the fully dynamic encoder 550 produces the same signals 532-538 using four static inverters 570). In the hybrid dynamic-static encoder 510, the outputs from the top sixty-four encoder rows and the corresponding outputs from the bottom sixty-four encoder rows (not shown) may be provided to appropriate logic gates to obtain the full 128-row result corresponding to output bits enc1_top 532, enc2_top 534, md1_top 536, and md2_top 538 (i.e., as shown in FIG. 7). Furthermore, the hybrid dynamic-static encoder 510 portion shown in FIG. 5 may provide similar physical area, power consumption, and leakage current savings relative to the fully dynamic encoder 550.

Referring now to FIG. 6, the structure 610 used in the hybrid dynamic-static encoder to produce encoded index bits <6,5,0>, multi-hit detection bits <6,5,0>, and the miss (or hit) bit can all be combined into one DAA column 610 with four dynamic nets (i.e., two dynamic nets 612, 614 in the top half shown in FIG. 6 and two dynamic nets (not shown) in the bottom half) that each have two bit-lines with sixteen pull-downs (or dots). In contrast, to produce the same encoded index bits <6,5,0>, multi-hit detection bits <6,5,0>, and miss (or hit) bit, the top half of the fully dynamic encoder 610 has eight DAA columns 651-658 with seven larger dynamic nets 652-658 that each have thirty-two pull-downs (or dots) and one larger dynamic net 651 that has sixty-four pull-downs (or dots), while the bottom half of the fully dynamic encoder 610 (not shown) has a similar structure (i.e., top half md_1<6>654 has no pull-downs, bottom half md_1<6>has sixty-four pull-downs, top half enc_1<6>651 has sixty-four pull-downs, and bottom half enc_1<6>has no pull-downs). Accordingly, the hybrid dynamic-static encoder 610 has 128 total pull-downs between the top and bottom encoder halves relative to 512 total pull-downs between the top and bottom halves of the fully dynamic encoder 650. Furthermore, as noted above, the hybrid dynamic-static encoder 610 need only evaluate one dynamic net when a single row matches rather than four in the fully dynamic encoder 650, which may provide substantial power savings relative to the fully dynamic encoder 650 because each dynamic net only spans thirty-two rows per enc_1 rather than sixty-four rows (i.e., reducing the wire cap) and because each dynamic net has only sixteen dots per enc_1 rather than thirty-two dots (i.e., reducing the diffusion cap). Similarly, the 128 pull-downs used to produce encoded index bits <6,5,0>, multi-hit detection bits <6,5,0>, and the miss (hit) bit via static circuit 630 can all be interleaved into one DAA column in the hybrid dynamic-static encoder 610 rather than the eight DAA columns 651-658 needed in the fully dynamic encoder 650, thereby providing a substantial area savings. Furthermore, as shown in FIG. 7, the outputs 632, 634, 636, 638, 639 from the top sixty-four encoder rows shown in FIG. 6 and the corresponding outputs from the bottom sixty-four encoder rows (not shown) may be provided to appropriate logic gates to obtain the full 128-row result corresponding to encoded index bits <6,5,0>, multi-hit detection bits <6,5,0>, and the miss (hit) bit. For example, encoded index bit enc<6>may correspond to enc6_top 632, multi-hit detection bit md<6>may correspond to enc6_bot (not shown), and enc6_top 632 and enc6_bot can be combined to obtain the miss (hit) bit, wherein hit=(enc6_top || enc6_bot). Although the path to produce the miss (hit) bit may have an added gate (and inversion) in the hybrid dynamic-static encoder 610, the overall delay may be comparable to the delay in the fully dynamic encoder 650.

Figure 7:
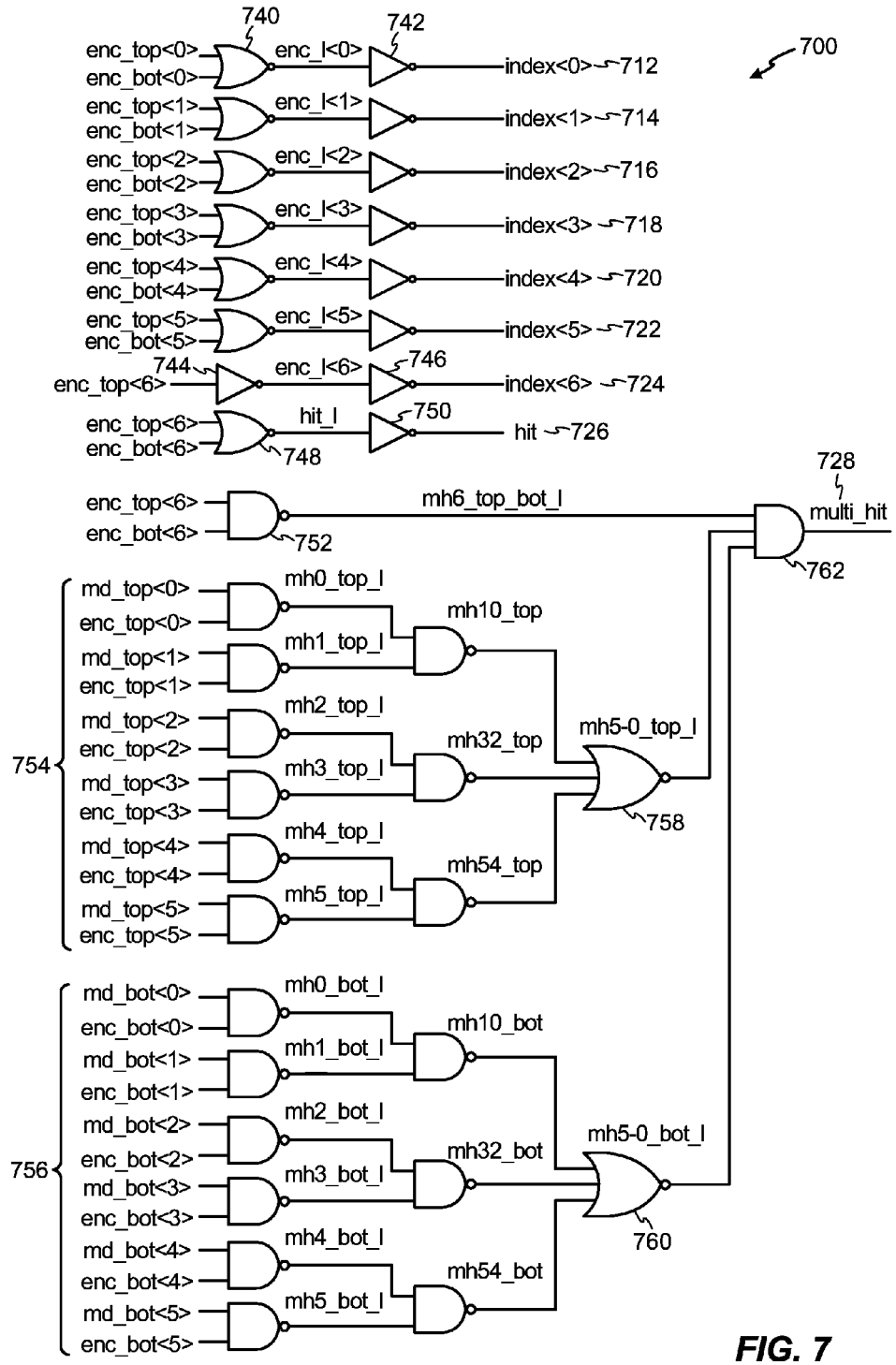
FIG. 7 illustrates logic to merge top and bottom rows associated with the hybrid dynamic-static encoder described herein into various output bits that represent whether a searchable array structure includes one or more entries that match a search key, according to one exemplary embodiment.

According to one exemplary embodiment, FIG. 7 illustrates a logic circuit 700 to merge the rows associated with the top and bottom halves in the hybrid dynamic-static encoder to derive the final encoded index output bits 712, 714, 716, 718, 720, 722, 724, hit output bit 726 that represents whether a searchable array structure includes one or more entries that match a search key, and multi-hit output bit 728 that represents whether the searchable array structure includes multiple entries that match the search key. For example, as shown therein, enc_top<0>and enc_bot<0>may be provided to a NOR gate 740 to produce enc_1<0>, which may then be provided to an inverter 742 to produce index<0>712, wherein index<1:5>714, 716, 718, 720, 722 may be produced with similar logic circuitry. Furthermore, enc_top<6>may be provided to a first inverter 744 to produce enc_1<6>, which may then be provided to a second inverter 746 to produce index<6>724, while enc_top<6>and enc_bot<6>may be provided to a NOR gate 748 to produce (miss) hit_1, which may then be provided to an inverter 750 to produce the hit output bit 726. With respect to the multi_hit output bit 728, enc_top<6>and enc_bot<6>may be provided to a first NAND gate 752, md_top<0:5>and enc_top<0:5>may be provided to a first group of six respective NAND gates as shown at 754, and md_bot<0:5>and enc_bot<0:5>may be similarly provided to a second group of six respective NAND gates as shown at 756. In one embodiment, as further shown at 754, outputs from the first group of NAND gates may then be provided to a third group of three additional NAND gates, and outputs from the second group of NAND gates may be similarly provided to a fourth group of three additional NAND gates as further shown at 756, wherein outputs from the third group of NAND gates may be provided to a first NOR gate 758 and outputs from the fourth group of NAND gates may be provided to a second NOR gate 760. As such, to produce the final multi_hit output bit 728, the output from the first NAND gate 752, the output from the first NOR gate 758, and the output from the second NOR gate 760 may be provided to an AND gate 762, which may output the final multi_hit output bit 728.

Figure 8:
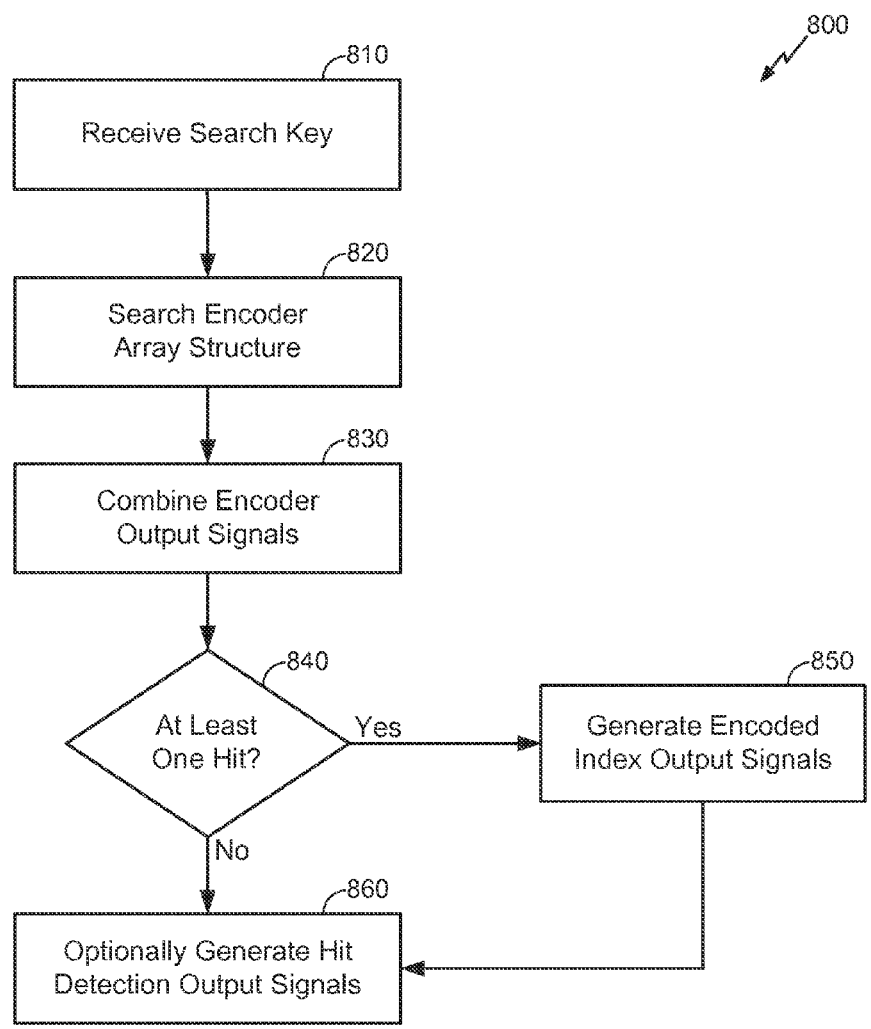
FIG. 8 illustrates an exemplary method for using the hybrid dynamic-static encoder described herein to generate one or more output signals that indicate whether one or more entries in an array structure match a search key, according to one exemplary embodiment.

According to one embodiment, FIG. 8 illustrates a method 800 for using the hybrid dynamic-static encoder described in further detail above to generate one or more output signals that indicate whether one or more entries in an array structure match a search key. For brevity and ease of description, various details relating to certain components, functionality, or other aspects associated with the hybrid dynamic-static encoder that may be used in the method 800 shown in FIG. 8 may be omitted herein to the extent that the same or similar details have already been provided above.

In one embodiment, the method 800 for detecting one or more hits in the searchable array structure may initially comprise receiving a search key at block 810, which may then be used to search the array structure associated with the hybrid dynamic-static encoder structure at block 820. The hybrid dynamic-static encoder structure may then generate one or more output signals that indicate whether one or more rows that are respectively dotted onto one of a plurality of dynamic nets arranged across one or more DAA columns match the search key, wherein the output signals may be combined at block 830. In one embodiment, the combined output signals generated in the plurality of dynamic nets may be analyzed at block 840 to determine whether one or more rows in the array structure match the search key. As such, if a row in the array structure matches the search key, an encoded index output signal that uniquely identifies the matching row may be generated at block 850 (e.g., an address associated with the matching row that corresponds to an entry in the searchable array structure). Furthermore, in one embodiment, the encoded index output signal may be only be valid to represent an entry in the searchable array structure if only one row matches the search key. In one embodiment, hit detection and/or multi-hit detection output signals may optionally be generated at block 860. For example, the hit detection and multi-hit detection output signals may be asserted (e.g., to logic high) if multiple rows in the array structure match the search key. In another example, the hit detection output signal may be asserted (e.g., to logic high) and the multi-hit detection output signal may be unasserted (e.g., to logic low) if only one row in the array structure matches the search key. In still another example, the hit detection and multi-hit detection output signals may be unasserted (e.g., to logic low) if the array structure does not have any rows that match the search key.

Figure 9:
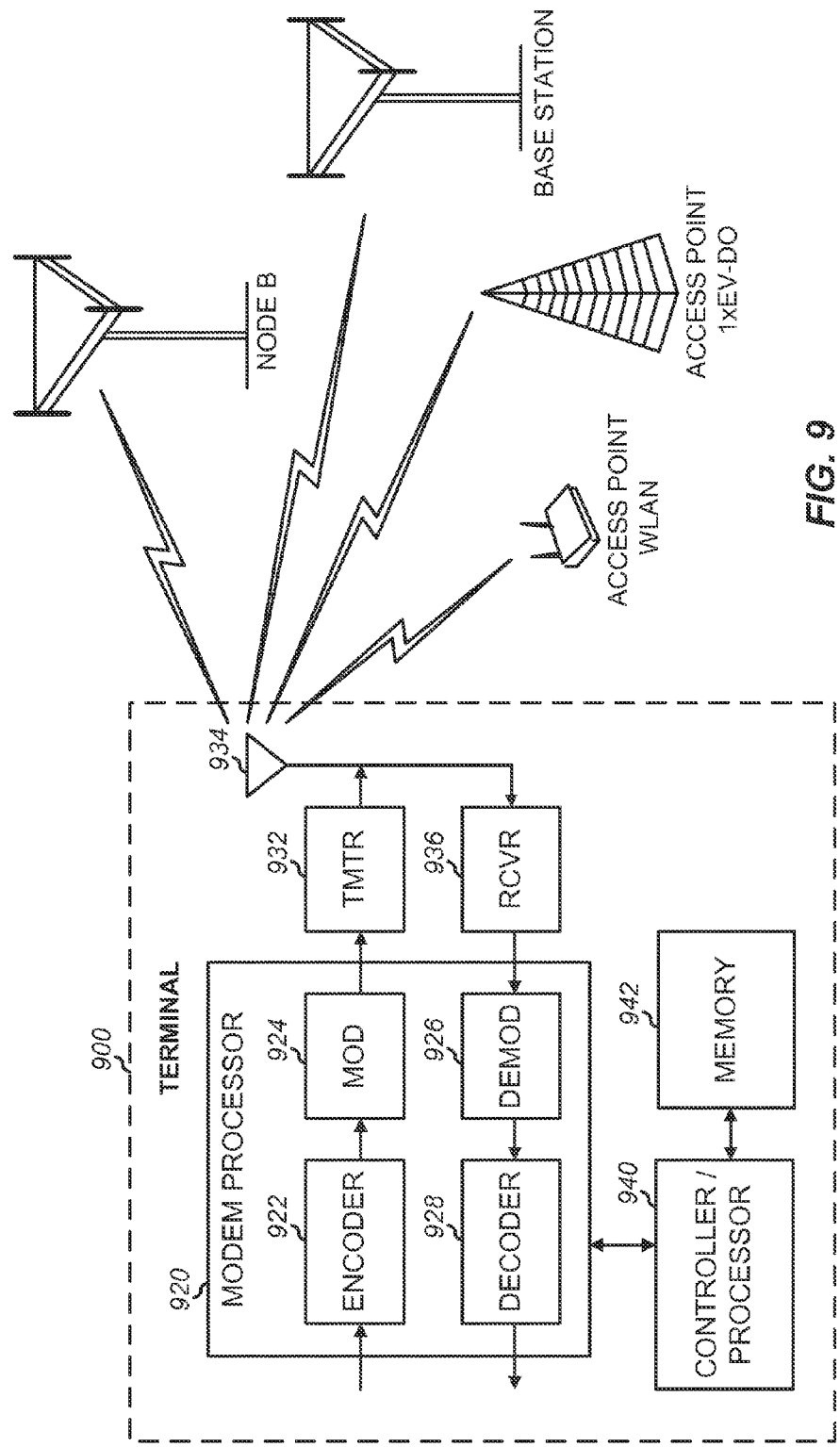
FIG. 9 illustrates an exemplary block diagram corresponding to a wireless communication device with a memory architecture that may implement the hybrid dynamic-static encoder described herein, according to one exemplary embodiment.

According to one embodiment, FIG. 9 illustrates an exemplary block diagram that may correspond to a wireless communication device 900 with a memory architecture that may implement the hybrid dynamic-static encoder with optional hit and/or multi-hit detection described herein. On a transmit path, an encoder 922 may receive data and signaling to be sent by the wireless communication device 900 to a base station, a Node B, or an access point. The encoder 922 may process (e.g., format, encode, and interleave) the data and signaling in accordance with a suitable coding scheme. A modulator (Mod) 924 may further process (e.g., modulate and scramble) the coded data and signaling and generate output chips. In general, the processing by the encoder 922 and the modulator 924 may be determined by the radio technology (e.g., IEEE 802.11, 1x, 1xEV-DO, UMTS, or GSM) for a wireless network to which data is sent. In one embodiment, a transmitter (TMTR) 932 may condition (e.g., convert to analog, filter, amplify, and frequency upconvert) the output chips and generate a radio frequency (RF) signal, which may be transmitted to the base station. Node B, or access point over the wireless network via an antenna 934.

In one embodiment, on a receive path, the antenna 934 may receive RF signals transmitted by base stations, Node Bs, and/or access points. A receiver (RCVR) 936 may condition (e.g., filter, amplify, frequency downconvert, and digitize) the received RF signal from antenna 934 and provide samples. A demodulator (Demod) 926 may process (e.g., descramble and demodulate) the samples and provide symbol estimates. A decoder 928 may process (e.g., deinterleave and decode) the symbol estimates and provide decoded data and signaling. In general, the processing by the demodulator 926 and the decoder 928 may be complementary to the processing performed by the modulator and the encoder at the base stations, Node Bs, and/or access points. Furthermore, in one embodiment, the encoder 922, the modulator 924, the demodulator 926, and the decoder 928 may be implemented in a modem processor 920. Although FIG. 9 shows one instance of each processing unit for simplicity, in general, there may be one or multiple modem processors, transmitters, receivers, controllers, and memories for different radio technologies supported by wireless communication device 900.

In one embodiment, a controller/processor 940 may direct the operation of various processing units at wireless communication device 900. For example, in one embodiment, the controller/processor 940 and/or other processing units within wireless communication device 900 may implement various features to utilize the hybrid dynamic-static encoder with optional hit and/or multi-hit detection described above with reference to FIGS. 3-8. Controller/processor 940 may also implement or direct any other suitable processes or features described herein. In one embodiment, a memory 942 may store program codes and data for wireless communication device 900. Memory 942 may also store one or more searchable array structures, encoder circuitry, virtual-to-physical memory address mappings, or any other suitable data or information that may support the features and functions associated with the hybrid dynamic-static encoder described herein, applications associated with the wireless communication device 900, and/or radio technologies used on the wireless communication device 900.

Although the foregoing describes a wireless communication device 900 with a memory architecture that may implement the hybrid dynamic-static encoder described herein, those skilled in the art will appreciate that the hybrid dynamic-static encoder may be employed or otherwise implemented in any suitable component associated with the wireless communication device 900, or any other suitable electrical device, circuit, or other component, which can receive multiple electrical signals that generally represent a search key and use the hybrid dynamic-static encoder to detect whether one or more entries in an array structure associated therewith match the search key, generate a binary hit detection output to indicate whether at least entry in the array structure matches the search key, generate a binary multi-hit detection output to indicate whether at least two entries in the array structure matches the search key, and/or generate unique index numbers to identify any entries in the array structure that match the search key.

Figure 10:
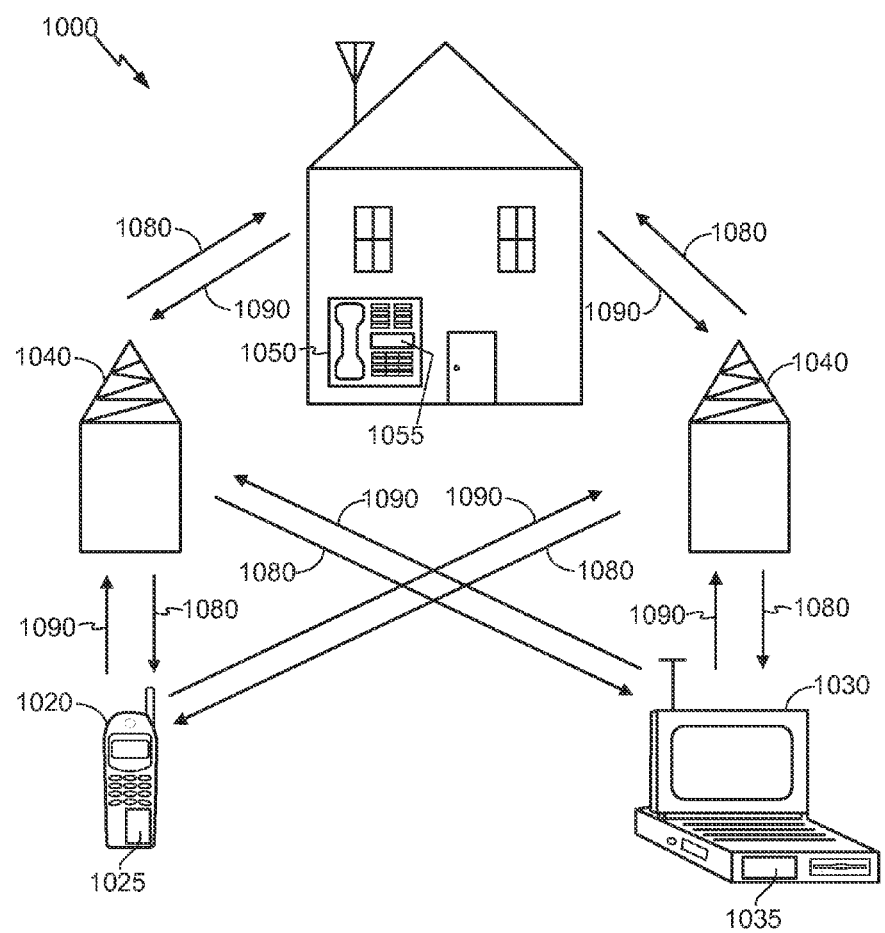
FIG. 10 illustrates an exemplary communication system that includes one or more communication devices with memory architectures that may implement the hybrid dynamic-static encoder described herein, according to one exemplary embodiment.

According to one embodiment. FIG. 10 illustrates an exemplary communication system 1000 that includes one or more communication devices with memory architectures that may implement the hybrid dynamic-static encoder described herein. For purposes of illustration, FIG. 10 shows three communication devices 1020, 1030, and 1050 and two base stations 1040. Those skilled in the pertinent art will recognize that other wireless communication systems in accordance with the exemplary embodiments described herein may have more or fewer communication devices and/or base stations without departing from the scope or spirit of the exemplary embodiments described herein. In one embodiment, the communication devices 1020, 1030, and 1050 may include respective semiconductor devices 1025, 1035, and 1055, wherein the communication devices 1020, 1030, and 1050 and/or the semiconductor devices 1025, 1035, and 1055 respectively associated therewith may include devices in which the hybrid dynamic-static encoder described herein may be implemented. In one embodiment, as shown in FIG. 10, one or more forward link signals 1080 may be used to communicate data from the base stations 1040 to the communication devices 1020, 1030, and 1050 and one or more reverse link signals 1090 may be used to communicate data from the communication devices 1020, 1030, and 1050 to the base stations 1040.

In the exemplary embodiment shown in FIG. 10, communication device 1020 may comprise a mobile telephone, communication device 1030 may comprise a portable computer, and communication device 1050 may comprise a fixed-location remote unit in a wireless local loop system (e.g., meter reading equipment). In various embodiments, however, the communication devices 1020, 1030, and 1050 may include mobile phones, handheld personal communication systems units, portable data units, personal data assistants, navigation devices (e.g., GPS-enabled or location-aware devices), set-top boxes, music players, video players, entertainment units, fixed-location data units, or any other device or combination of devices that can suitably store, retrieve, communicate, or otherwise process data and/or computer-executable instructions. Although FIG. 10 illustrates communication devices 1020, 1030, and 1050 according to the teachings of the disclosure, those skilled in the pertinent art will appreciate that the disclosure shall not be limited to these exemplary illustrated communication devices 1020, 1030, and 1050. Accordingly, various embodiments may be suitably employed or otherwise implemented in any suitable device that has active integrated circuitry including memory and on-chip circuitry for test and characterization.

Those skilled in the pertinent art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any suitable combination thereof.

Further, many embodiments may be described in terms of logical blocks, modules, circuits, algorithms, steps, and sequences of actions, which may be performed or otherwise controlled with a general purpose processor, a DSP, an application specific integrated circuit (ASIC), a field programmable gate array, programmable logic devices, discrete gates, transistor logic, discrete hardware components, elements associated with a computing device, or any suitable combination thereof designed to perform or otherwise control the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Further, those skilled in the pertinent art will appreciate that the various illustrative logical blocks, modules, circuits, algorithms, and steps described in connection with the embodiments disclosed herein may be implemented as electronic hardware, computer software, or any suitable combinations thereof. To clearly illustrate this interchangeability of hardware and software, various illustrative components, blocks, modules, circuits, algorithms, and steps have been described above in terms of their general functionality. Whether such functionality is implemented in hardware or software depends upon the particular application and design constraints, and those skilled in the pertinent art may implement the described functionality in various ways to suit each particular application, but such implementation decisions should not be interpreted as causing a departure from the scope or spirit of the present disclosure. Additionally, the various logical blocks, modules, circuits, algorithms, steps, and sequences of actions described herein can be considered to be embodied entirely within any form of computer readable storage medium having stored therein a corresponding set of computer instructions that upon execution would cause an associated processor to perform the functionality described herein. Thus, the various aspects and embodiments disclosed herein may be embodied in a number of different forms, all of which have been contemplated to be within the scope or spirit of the claimed subject matter. In addition, for each of the embodiments described herein, the corresponding form of any such embodiments may be described herein as, for example, "logic configured to" perform the described action, The methods, sequences and/or algorithms described in connection with the embodiments disclosed herein may be embodied directly in hardware, in a software module executed by a processor, or any suitable combination thereof. Software modules may reside in memory controllers, DDR memory. RAM, flash memory, ROM, electrically programmable ROM memory (EPROM), electrically erase programmable ROM (EEPROM), registers, hard disks, removable disks, CD-ROMs, or any other storage medium known in the art or storage medium that may be developed in the future. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal or other computing device. In the alternative, the processor and the storage medium may reside as discrete components in a user terminal or other computing device.

In one or more exemplary embodiments, the control functions described may be implemented in hardware, software, firmware, or any combination thereof. If implemented in software, the functions may be stored on or transmitted over as one or more instructions or code on a computer-readable medium. Computer-readable media includes both storage media and communication media, including any medium that facilitates transferring a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage, or other magnetic storage devices or media that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative embodiments of the hybrid dynamic-static encoder with optional hit and/or multi-hit detection disclosed herein, those skilled in the pertinent art will appreciate that various changes and modifications could be made herein without departing from the scope or spirit of the disclosure, as defined by the appended claims. For example, those skilled in the art will appreciate that the hybrid dynamic-static encoder described herein may be employed or otherwise implemented in any suitable electrical device, circuit, or other component that can receive multiple electrical signals that generally represent a search key and use the hybrid dynamic-static encoder to detect whether one or more entries in an array structure associated therewith match the search key, generate a binary hit detection output to indicate whether at least entry in the array structure matches the search key, generate a binary multi-hit detection output to indicate whether at least two entries in the array structure matches the search key, and/or generate unique index numbers to identify any entries in the array structure that match the search key. Furthermore, the functions, steps, operations, and/or actions of the method claims in accordance with the embodiments disclosed herein need not be performed in any particular order, and although elements of the aspects and embodiments disclosed herein may be described or claimed in the singular, the plural is contemplated unless limitation to the singular is explicitly stated.

What is claimed is:

1. A hybrid dynamic-static encoder, comprising:
    an array structure having X rows that are each coupled to a plurality of device active area (DAA) columns and a respective match line that is asserted to indicate that the row corresponds to an entry in the array structure that matches a search key or unasserted to indicate that the entry corresponding to the row mismatches the search key, wherein each DAA column comprises a physical area that houses:
        a plurality of dynamic nets;
        X dynamic pull-down devices coupled to the plurality of dynamic nets such that the X rows in the array structure each include one of the X dynamic pull-down devices and the match line coupled to each row in the array structure that matches the search key is asserted; and
        a static circuit coupled to the plurality of dynamic nets, wherein the static circuit comprises a plurality of multi-input logic gates configured to produce a plurality of signals that include at least one or more encoded index signals and at least one multi-hit detection signal; and
    a logic circuit configured to receive the plurality of signals produced by the static circuit in each DAA column and to derive at least a hit signal that indicates whether one or more rows in the array structure match the search key and a multi-hit signal that indicates whether multiple rows in the array structure match the search key.

2. The hybrid dynamic-static encoder recited in claim 1, wherein the logic circuit is further configured to derive a multi-bit encoded index if at least one of the rows in the array structure corresponds to an entry that matches the search key.

3. The hybrid dynamic-static encoder recited in claim 2, wherein the multi-bit encoded index uniquely identifies an address corresponding to the at least one row in the array structure.

4. The hybrid dynamic-static encoder recited in claim 1, wherein the plurality of dynamic nets in each DAA column comprise:
    a first set of dynamic nets in a top half of the hybrid dynamic-static encoder, wherein the top half comprises X/2 rows; and
    a second set of dynamic nets in a bottom half of the hybrid dynamic-static encoder, wherein the bottom half comprises X/2 rows.

5. The hybrid dynamic-static encoder recited in claim 4, wherein the plurality of multi-input logic gates in the static circuit associated with each DAA column comprises a first set of NAND gates in the top half that are configured to evaluate the first set of dynamic nets in the top half of the DAA column to produce a first set of the one or more encoded index signals and the at least one multi-hit detection signal.

6. The hybrid dynamic-static encoder recited in claim 5, wherein the plurality of multi-input logic gates in the static circuit associated with each DAA column further comprises a second set of NAND gates in the bottom half that are configured to evaluate the second set of dynamic nets in the bottom half of the DAA column to produce a second set of the one or more encoded index signals and the at least one multi-hit detection signal.

7. The hybrid dynamic-static encoder recited in claim 1, wherein the static circuit in each DAA column has a gate delay count substantially equivalent to a fully dynamic encoder.

8. A method for detecting one or more hits in a searchable array structure, comprising:
receiving a search key;
searching an array structure associated with a hybrid dynamic-static encoder using the received search key, wherein the array structure has X rows that are each coupled to a plurality of device active area (DAA) columns and a respective match line that is asserted to indicate that the row corresponds to an entry in the array structure that matches a search key or unasserted to indicate that the entry corresponding to the row mismatches the search key, wherein each DAA column comprises a physical area that houses:
a plurality of dynamic nets,
X dynamic pull-down devices coupled to the plurality of dynamic nets such that the X rows in the array structure each include one of the X dynamic pull-down devices and the match line coupled to each row in the array structure that matches the search key is asserted, and
a static circuit coupled to the plurality of dynamic nets, wherein the static circuit comprises a plurality of multi-input logic gates configured to produce a plurality of signals that include at least one or more encoded index signals and at least one multi-hit detection signal; and
deriving at least a hit signal that indicates whether one or more rows in the array structure match the search key and a multi-hit signal that indicates whether multiple rows in the array structure match the search key according to the plurality of signals produced by the static circuit in each DAA column.

9. The method recited in claim 8, further comprising:
deriving a multi-bit encoded index in response to at least one of the rows in the array structure corresponding to an entry that matches the search key.

10. The method recited in claim 9, wherein the multi-bit encoded index uniquely identifies an address corresponding to the at least one row in the array structure.

11. A method for detecting one or more hits in a searchable array structure, comprising:
receiving a search key;
searching an array structure associated with a hybrid dynamic-static encoder using the received search key, wherein the array structure has X rows and the hybrid dynamic-static encoder includes one or more first device active area (DAA) columns that each have X dynamic pull-down devices arranged across X/32 dynamic nets that each span X/2 rows and one or more additional DAA columns that each have X dynamic pull-down devices arranged across X/16 dynamic nets that each span X/2 rows, and wherein the hybrid dynamic-static encoder further includes a top half and a bottom half that each have X/2 rows that are respectively dotted onto one of the dynamic nets associated with at least one of the first DAA columns and one of the dynamic nets associated with each additional DAA column; and
deriving one or more encoded index signals that indicate whether at least one row in the array structure matches the search key based on combined output signals generated in the one or more first DAA columns and the one or more additional DAA columns.

12. The method recited in claim 8, wherein the hybrid dynamic-static encoder has a gate delay count substantially equivalent to a fully dynamic encoder.

13. An apparatus, comprising:
means for receiving a search key;
means for searching an array structure associated with a hybrid dynamic-static encoder using the received search key, wherein the array structure has X rows that are each coupled to a plurality of device active area (DAA) columns and a respective match line that is asserted to indicate that the row corresponds to an entry in the array structure that matches a search key or unasserted to indicate that the entry corresponding to the row mismatches the search key, wherein each DAA column comprises a physical area that houses:
a plurality of dynamic nets,
X dynamic pull-down devices coupled to the plurality of dynamic nets such that the X rows in the array structure each include one of the X dynamic pull-down devices and the match line coupled to each row in the array structure that matches the search key is asserted, and
a static circuit coupled to the plurality of dynamic nets, wherein the static circuit comprises a plurality of multi-input logic gates configured to produce a plurality of signals that include at least one or more encoded index signals and at least one multi-hit detection signal; and
means for deriving at least a hit signal that indicates whether one or more rows in the array structure match the search key and a multi-hit signal that indicates whether multiple rows in the array structure match the search key according to the plurality of signals produced by the static circuit in each DAA column.

14. The apparatus recited in claim 13, further comprising:
means for deriving a multi-bit encoded index in response to at least one of the rows in the array structure corresponding to an entry that matches the search key.

15. The apparatus recited in claim 14, wherein:
the multi-bit encoded index uniquely identifies an address corresponding to the at least one row in the array structure.

16. A computer-readable storage medium having computer-executable instructions recorded thereon, wherein executing the computer-executable instructions on one or more processors causes the one or more processors to:
receive a search key;
search an array structure associated with a hybrid dynamic-static encoder using the received search key, wherein the array structure has X rows and the hybrid dynamic-static encoder includes one or more first device active area (DAA) columns that each have X dynamic pull-down devices arranged across X/32 dynamic nets that each span X/2 rows and one or more additional DAA columns that each have X dynamic pull-down devices arranged across X/16 dynamic nets that each span X/2 rows, and wherein the hybrid dynamic-static encoder further includes a top half and a bottom half that each have X/2 rows that are respectively dotted onto one of the dynamic nets associated with at least one of the first DAA columns and one of the dynamic nets associated with each additional DAA column; and
derive one or more encoded index signals that indicate whether one or more rows in the array structure match the search key based on combined output signals generated in the one or more first DAA columns and the one or more additional DAA columns.

17. A hybrid dynamic-static encoder, comprising:
an array structure having X rows;
one or more first device active area (DAA) columns, each first DAA column having X dynamic pull-down devices arranged across X/32 dynamic nets that each span X/2 rows;
one or more additional DAA columns, each additional DAA column having X dynamic pull-down devices arranged across X/16 dynamic nets that each span X/2 rows;
a top half having X/2 rows that are respectively dotted onto one of the dynamic nets associated with at least one of the first DAA columns and one of the dynamic nets associated with each additional DAA column;
a bottom half having X/2 rows that are respectively dotted onto one of the dynamic nets associated with at least one of the first DAA columns and one of the dynamic nets associated with each additional DAA column; and
means for deriving one or more encoded index signals that indicate whether one or more rows in the array structure match a search key based on combined output signals generated in the one or more first DAA columns and the one or more additional DAA columns.

18. The hybrid dynamic-static encoder recited in claim 17, further comprising:
means for deriving a hit signal that indicates whether at least one row in the array structure matches the search key based on the combined output signals.

19. The hybrid dynamic-static encoder recited in claim 17, further comprising:
means for deriving a multi-hit signal that indicates whether multiple rows in the array structure match the search key based on the combined output signals.

20. The hybrid dynamic-static encoder recited in claim 17, wherein at least one of the encoded index signals uniquely identifies a row in the array structure that matches the search key.

21. The hybrid dynamic-static encoder recited in claim 17, wherein the top half and the bottom half each include logic configured to evaluate the plurality of dynamic nets associated with each DAA column in response to one or more rows in the array structure matching the search key.

22. The hybrid dynamic-static encoder recited in claim 17, wherein the one or more first DAA columns and the one or more additional DAA columns comprise physical areas to house one or more of n-channel field effect transistor (NFET) devices, p-channel field effect transistor (PFET) devices, diffused silicon logic components, or circuitry to produce the output signals generated therein.

23. A hybrid dynamic-static encoder, comprising:
an array structure having X rows, where X equals 128 and the array structure has X entries,
one first device active area (DAA) column that has X dynamic pull-down devices arranged across X/32 dynamic nets that each span X/2 rows such that the one first DAA column has 128 dynamic pull-down devices arranged across four dynamic nets that each have thirty-two dots and span thirty-two rows;
two additional DAA columns that each have X dynamic pull-down devices arranged across X/16 dynamic nets that each span X/2 rows such that the two additional DAA columns each have 128 dynamic pull-down devices arranged across eight dynamic nets that each have sixteen dots and span thirty-two rows; and
means for deriving one or more encoded index signals that indicate whether one or more rows in the array structure match a search key based on combined output signals generated in the first DAA column and the two additional DAA columns.

* * * * *